(12) United States Patent
Mallik et al.

(10) Patent No.: US 9,331,474 B1
(45) Date of Patent: May 3, 2016

(54) OVER-VOLTAGE PROTECTION CIRCUIT FOR A DRIVE TRANSISTOR

(71) Applicants: STMicroelectronics International N.V., Amsterdam (NL); STMicroelectronics S.r.l., Agrate Brianza (IT)

(72) Inventors: Ranajay Mallik, Ghaziabad (IN); Luigi Abbatelli, Catania (IT); Giuseppe Catalisano, Carlentini (IT); Akshat Jain, Nahan (IN)

(73) Assignees: STMICROELECTRONICS INTERNATIONAL N.V., Amsterdam (NL); STMICROELECTRONICS S.R.L., Agrate Brianza (IT)

( * ) Notice: Subject to any disclaimer, the term of this patent is extended or adjusted under 35 U.S.C. 154(b) by 97 days.

(21) Appl. No.: 14/509,427

(22) Filed: Oct. 8, 2014

(51) Int. Cl.
    *H02H 3/20* (2006.01)
    *H02H 9/04* (2006.01)
    *H02H 7/20* (2006.01)
    *H02H 1/00* (2006.01)

(52) U.S. Cl.
    CPC .............. *H02H 7/205* (2013.01); *H02H 1/0007* (2013.01)

(58) Field of Classification Search
    CPC .................................... H02H 3/20; H02H 9/04
    USPC .......................................................... 361/91.1
    See application file for complete search history.

(56) References Cited

U.S. PATENT DOCUMENTS

| | | | | |
|---|---|---|---|---|
| 4,371,824 A * | 2/1983 | Gritter | ................ | B60L 11/1803 318/681 |
| 4,890,185 A * | 12/1989 | Karl | ........................ | H02H 9/04 323/276 |
| 7,254,000 B1 * | 8/2007 | Smith | .................. | H02H 7/1213 323/224 |
| 7,315,439 B2 * | 1/2008 | Muenzer | ................ | H02H 9/047 361/91.1 |
| 2007/0084857 A1 | 4/2007 | Osaka | | |
| 2007/0216372 A1 * | 9/2007 | Weng | ..................... | H02M 3/156 323/222 |
| 2007/0279820 A1 * | 12/2007 | Fang | ..................... | H02H 7/1203 361/97 |
| 2011/0102950 A1 * | 5/2011 | Park | ..................... | H02M 1/4225 361/18 |
| 2011/0292554 A1 * | 12/2011 | Yao | ........................... | H03F 1/52 361/56 |
| 2012/0236456 A1 * | 9/2012 | Yu | ....................... | H03K 17/0822 361/91.1 |
| 2012/0320476 A1 | 12/2012 | Disney | | |
| 2013/0277362 A1 | 10/2013 | Ribarich et al. | | |
| 2014/0204492 A1 * | 7/2014 | Hu | ......................... | H02H 9/041 361/91.1 |

FOREIGN PATENT DOCUMENTS

| | | |
|---|---|---|
| EP | 2690923 A1 | 1/2014 |
| GB | 2062985 A | 5/1981 |

OTHER PUBLICATIONS

EP Search Report for co-pending EP 15187680.2 dated Feb. 17, 2016 (9 pages).

* cited by examiner

*Primary Examiner* — Dharti Patel
(74) *Attorney, Agent, or Firm* — Gardere Wynne Sewell LLP

(57) ABSTRACT

A drive transistor is connected to a resonant load in a low-side drive configuration. The voltage across the conduction terminals of the drive transistor is sensed and compared to an over-voltage threshold. An over-voltage signal is asserted in response to the comparison. The drive transistor is controlled by a PWM control signal in normal mode. In response to the assertion of the over-voltage signal, the drive transistor is forced to turn on (irrespective of the PWM control signal) to relieve the over-voltage condition. Operation of the circuit may be disabled or forced into soft start mode in response to the assertion of the over-voltage signal. Additionally, the pulse width of the PWM control signal may be reduced in response to the assertion of the over-voltage signal.

24 Claims, 4 Drawing Sheets

OVER-VOLTAGE PROTECTION CIRCUIT FOR A DRIVE TRANSISTOR

TECHNICAL FIELD

This disclosure relates generally to an over-voltage protection circuit, and more particularly to an over-voltage protection circuit configured to protect a pulse width modulation (PWM) controlled drive transistor.

BACKGROUND

It is known in the art to provide a low-side drive transistor coupled to a load circuit. For example, the low-side drive transistor may comprise an insulated gate bi-polar transistor (IGBT) and the load circuit may comprise a resonant tank circuit. This circuit configuration is illustrated in FIG. 1. The resonant tank circuit may, for example, comprise an inductance and capacitance coupled in parallel. A first terminal of the resonant tank circuit is coupled to a DC supply node. A second terminal of the resonant tank circuit is coupled to a collector terminal of the IGBT. The emitter terminal of the IGBT is coupled to a reference supply node (for example, ground). The gate terminal of the IGBT is driven by a drive signal output from a gate driver circuit. The gate driver circuit may, for example, comprise a totem pole push-pull driver circuit as known in the art. The gate driver circuit is actuated by a pulse width modulation (PWM) control signal generated by a PWM generator circuit.

In a number of applications, the IGBT may be damaged as a result of an over-voltage condition. There is a need in the art to protect the IGBT.

SUMMARY

In an embodiment, a circuit comprises: a drive transistor having a control terminal configured to receive a drive signal and having a first conduction terminal and a second conduction terminal, wherein said first conduction terminal is configured for connection to a load circuit; a sense circuit configured to sense a voltage across the first and second conduction terminals; a comparator circuit configured to compare the sensed voltage to voltage threshold and generate a signal indicative of an over-voltage condition; and drive circuitry configured to generate said drive signal in response to a pulse width modulation (PWM) signal, said drive circuit including a force on circuit actuated in response to said signal indicative of the over-voltage condition to force said drive transistor to turn on irrespective of the PWM signal.

In an embodiment, a method comprises: applying a drive signal to a control terminal of a drive transistor including a conduction terminal configured for connection to a load circuit; sensing a voltage across the first and second conduction terminals; comparing the sensed voltage to voltage threshold; generating a signal indicative of an over-voltage condition in response to said comparing; and generating said drive signal in response to a pulse width modulation (PWM) signal, wherein generating further comprises forcing said drive transistor to turn on in response to said signal indicative of the over-voltage condition irrespective of the PWM signal.

In an embodiment, a circuit comprises: a drive transistor having a control terminal configured to receive a drive signal and having a first conduction terminal and a second conduction terminal, wherein said first conduction terminal is configured for connection to a load circuit; a sense circuit configured to sense a voltage across the first and second conduction terminals; a comparator circuit configured to compare the sensed voltage to voltage threshold and generate a signal indicative of an over-voltage condition; a pulse width modulation (PWM) signal generator configured to generate a PWM signal; and a drive circuit configured to generate said drive signal in response to said PWM signal if the signal indicative of an over-voltage condition is not asserted and otherwise force said drive transistor to turn on if the signal indicative of the over-voltage condition is asserted.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF THE DRAWINGS

Figure 1:
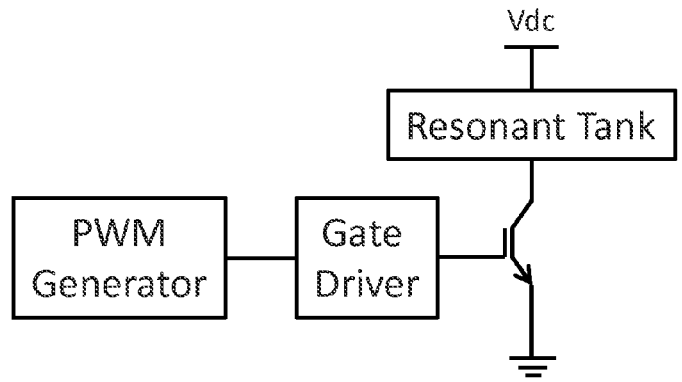
FIG. 1 is a circuit diagram for a low-side drive circuit.
Figure 2:
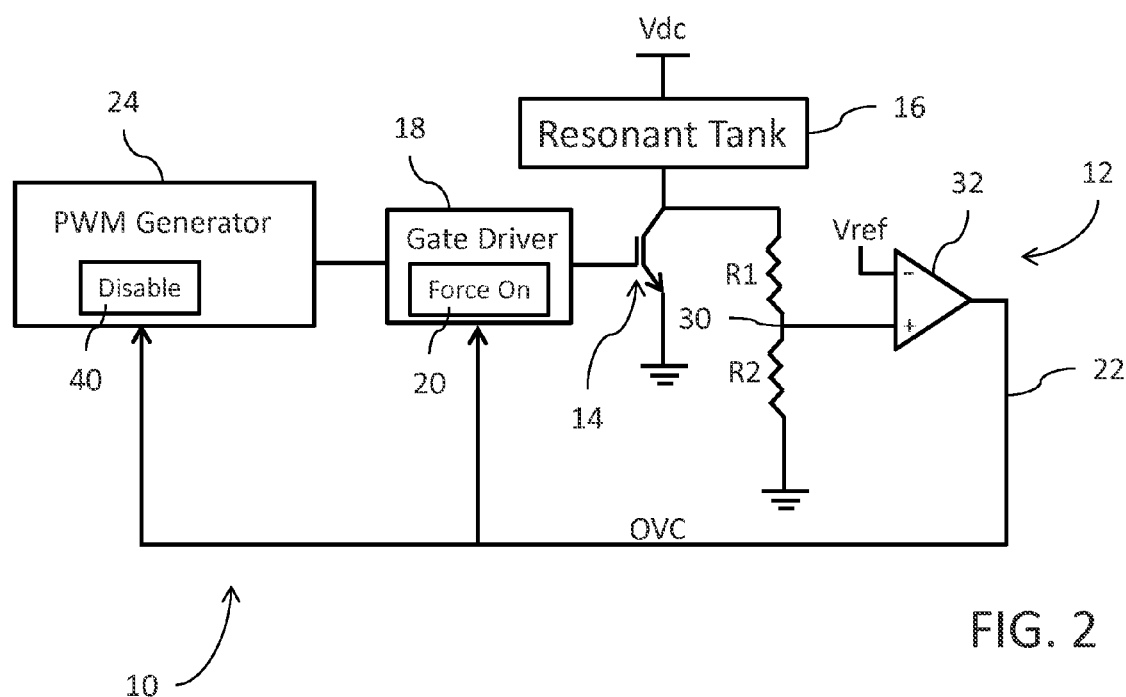
FIG. 2 is a circuit diagram for a low-side drive circuit including an embodiment for an over-voltage protection circuit.

Reference is now made to FIG. 2 showing a circuit diagram for a low-side drive circuit 10 including an embodiment for an over-voltage protection circuit 12. The circuit 10 includes a low-side drive transistor 14 coupled to a load circuit 16. For example, the low-side drive transistor 14 may comprise an insulated gate bi-polar transistor (IGBT) and the load circuit 16 may comprise a resonant tank circuit. The resonant tank circuit may, for example, comprise an inductance and capacitance coupled in parallel. A first terminal of the resonant tank circuit is coupled to a DC supply node configured to receive a DC supply voltage Vdc. A second terminal of the resonant tank circuit is coupled to a collector terminal of the IGBT 14. The emitter terminal of the IGBT 14 is coupled to a reference supply node (for example, ground). The gate terminal of the IGBT is driven by a drive signal output from a gate driver circuit 18. The gate driver circuit 18 may, for example, comprise a totem pole push-pull driver circuit as known in the art. The gate driver circuit 18 is actuated by a pulse width modulation (PWM) control signal generated by a PWM generator circuit 24. The gate driver circuit 18 further includes a force on circuit 20 that is configured, when actuated by the assertion of an over-voltage control (OVC) signal on feedback line 22, to cause the gate driver circuit 18 to output a drive signal that forces the IGBT 14 to turn on irrespective of the PWM control signal.

The over-voltage protection circuit 12 includes a resistive divider circuit formed by series connected resistors R1 and R2 and configured to function as a voltage sensor. One terminal of the resistive divider circuit is coupled to the collector terminal of the IGBT 14. The other terminal of the resistive divider circuit is coupled to the reference supply node. Thus, the voltage drop across the resistive divider circuit is equal to (or at least representative of) the voltage drop across the collector and emitter terminals of the IGBT 14 (i.e., the voltage drop equals Vce). The resistive divider circuit includes a tap node 30 at the series connection point of the resistors R1 and R2. The voltage at tap node 30 (V30) is a fraction of the voltage Vce, wherein that fraction is set by the resistance values of the resistors R1 and R2. The voltage V30 is applied to the non-inverting input terminal of a comparator circuit 32. The inverting input terminal of the comparator 32 receives a reference voltage Vref. The comparator circuit 32 compares the voltage V30 to the voltage Vref and generates the OVC signal on line 22 having a logic state responsive to the comparison. In particular, the OVC signal transitions to logic high (i.e., is asserted) when the voltage V30 exceeds the voltage Vref. In a preferred implementation, the comparator circuit 32 is a hysteresis comparator, so the comparison of voltage V30 and Vref leading the state changes for the OVC signal is subject to a built-in hysteresis. The force on circuit 20 operates responsive to assertion of the OVC signal. When the OVC signal is logic high, the force on circuit 20 causes the gate driver circuit 18 to force the drive signal to a logic high state (and thus turn on the IGBT 14) regardless of the state of the received PWM signal.

Figure 3A:
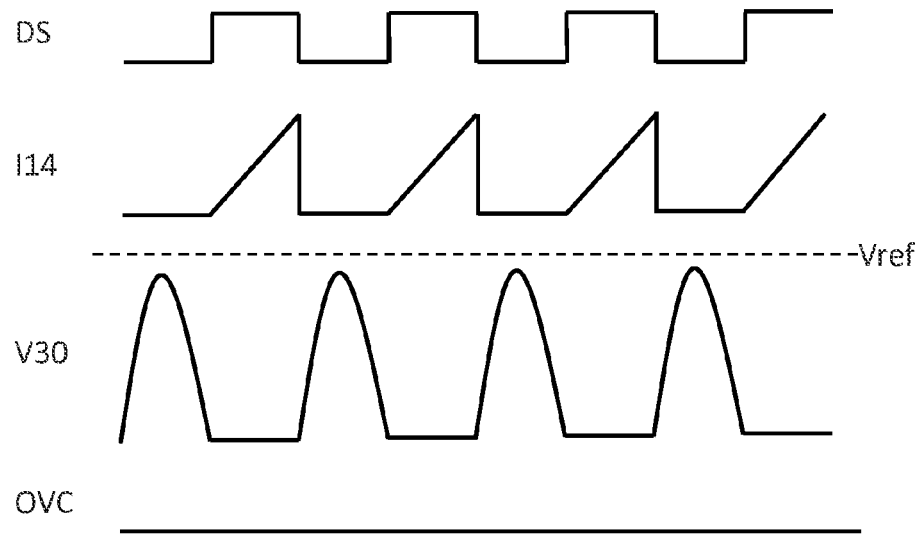
FIGS. 3A and 3B illustrate operating waveforms for the low-side drive circuit of FIG. 2.

Reference is now made to FIG. 3A showing operating waveforms for the low-side drive circuit 10 in the absence of an over-voltage condition. The first waveform shows the drive signal (DS) applied to the control terminal of the IGBT 14. The IGBT 14 is turned on when the drive signal DS is logic high. When the IGBT turns on, current flows through the conduction path from collector to emitter. As the load circuit 16 is a resonant tank circuit, the current flowing through the IGBT 14 (referenced as 114) will ramp up until the IGBT 14 is turned off when the drive signal DS transitions to logic low. At that point, the voltage across the collector to emitter terminals rises and then falls in accordance with the resonance characteristics of the load circuit 16. This voltage is sensed through the resistive divider circuit producing a corresponding voltage at node 30 (referenced as V30). It is this voltage V30 which is compared with the reference voltage Vref by the comparator circuit 32. FIG. 3A illustrates the operating condition where the voltage V30 does not exceed the reference voltage Vref. In this operating condition, the on-off state of the IGBT 14 is solely responsive to the PWM control signal and the OVC signal remains at logic low.

Figure 3B:
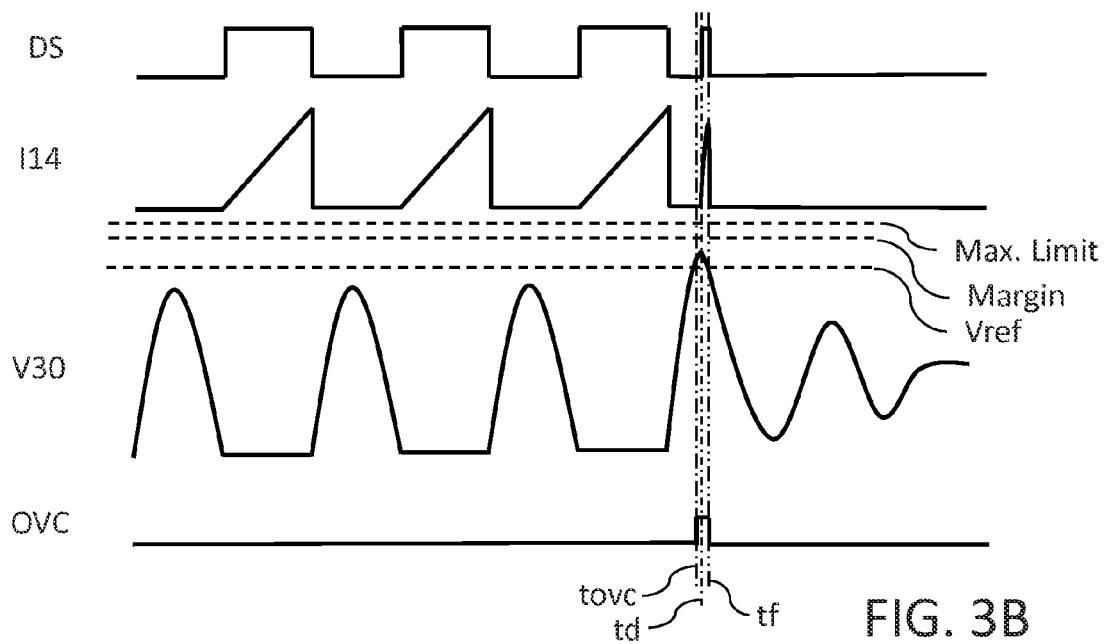

Reference is now made to FIG. 3B showing operating waveforms for the low-side drive circuit 10 in the presence of an over-voltage condition. The waveforms of FIG. 3B are similar to those of FIG. 3A except that at time tovc, the voltage across the collector to emitter terminals rises to experience an over-voltage condition. As an example, the over-voltage condition may arise due to a transient spike on the voltage Vdc, or perhaps due to an increase in the voltage Vdc. This is represented by the voltage V30 exceeding the reference voltage Vref. After a short delay (time td), the OVC signal at the output of the comparator circuit 32 changes state (i.e., transitions to logic high). The force on circuit 20 is responsive to the assertion of the OVC signal and forces the gate driver circuit 18 to output a logic high state for the drive signal DS (even though the PWM signal is logic low). This causes the IGBT 14 to turn on and current increases through the IGBT 14. The over-voltage condition is suppressed as the voltage V30 is shown to fall back below the reference voltage Vref in response to the IGBT 14 turning on. Thus occurs prior to the over-voltage rising to exceed either the essential margin set as a function of propagation delay or the maximum limit of the transistor device. When the voltage V30 falls back below the reference voltage Vref, the output of the comparator circuit 32 transitions the OVC signal back to logic low (at time tf) and the force on circuit 20 is deactuated. The gate driver circuit 18 is thereafter once again responsive to the PWM signal.

In the embodiment of FIG. 2, the PWM generator 24 includes disable circuitry 40 configured to disable operation of the PWM generator (i.e., terminate output of the PWM signal) in response to the logic high state of the OVC signal. Thus, the PWM signal remains logic low after time tovc, and the drive signal DS remains logic low after the OVC signal transitions back to logic low. The IGBT 14 is no longer actuated and the voltage across the collector to emitter terminals is left to ring out in accordance with the resonance characteristics of the load circuit 16.

Figure 4:
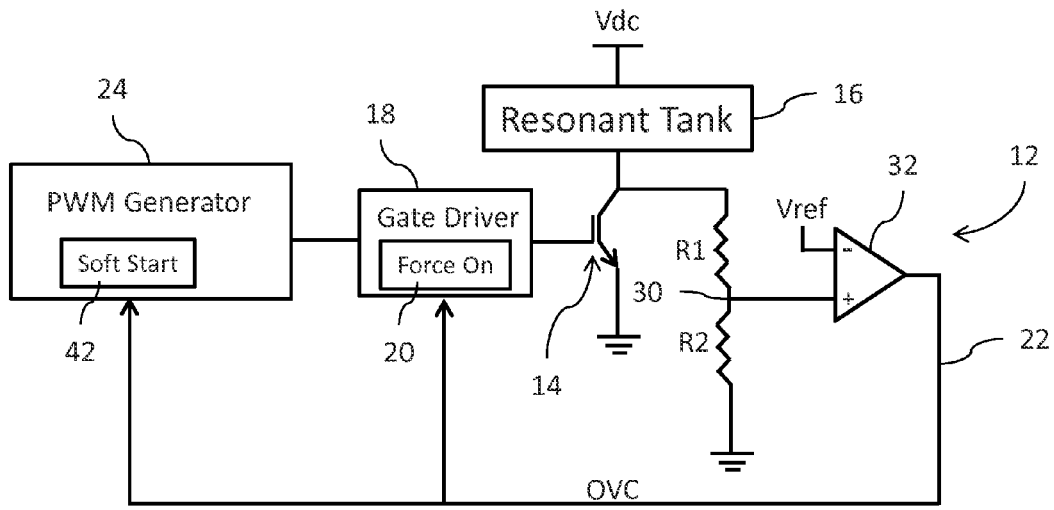
FIG. 4 is a circuit diagram for a low-side drive circuit including an embodiment for an over-voltage protection circuit.

In another embodiment as shown in FIG. 4, the PWM generator 24 includes soft-start circuitry 42 configured to implement a soft-start mode of operation for the PWM generator in response to the logic high state of the OVC signal. Thus, the PWM signal is initially driven logic low at time tovc, and the drive signal DS transitions to logic low after the OVC signal transitions back to logic low. The IGBT 14 is turned off and the voltage across the collector to emitter terminals is left to ring out in accordance with the resonance characteristics of the load circuit 16. After a delay time period, the PWM generator 24 is restarted with a reduced PWM duty cycle during start up. After the soft-start period ends, normal PWM drive operation proceeds (for example, like that present before time tovc).

Figure 5:
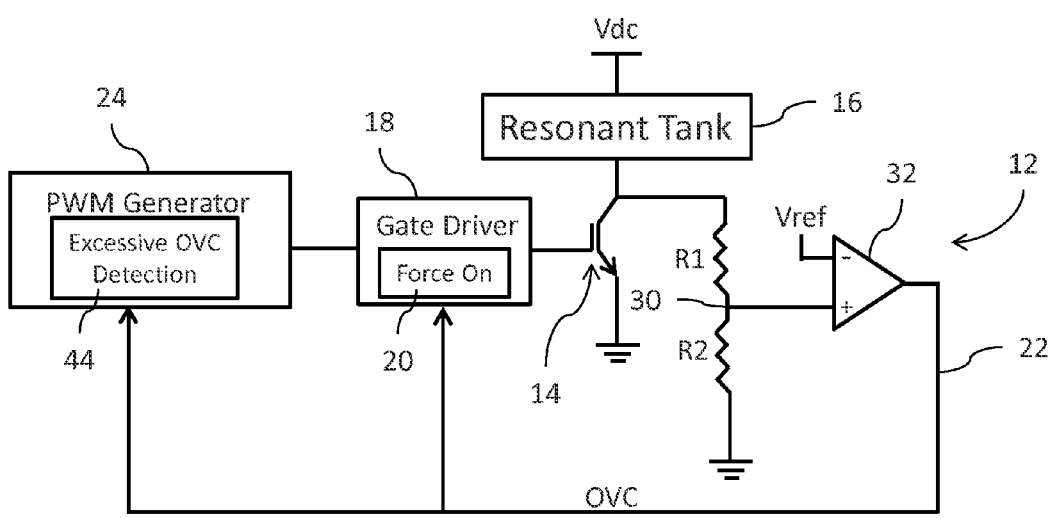
FIG. 5 is a circuit diagram for a low-side drive circuit including an embodiment for an over-voltage protection circuit.

In another embodiment as shown in FIG. 5, the PWM generator 24 includes excessive over-voltage condition detection circuitry 44 configured to modify the pulse width of the PWM signal output by the PWM generator in response to the number of incidents where the OVC signal has been asserted. Thus, the PWM signal is initially driven logic low at time tovc, and the drive signal DS remains logic low after the OVC signal transitions back to logic low. The IGBT 14 is turned off and the voltage across the collector to emitter terminals is left to ring out in accordance with the resonance characteristics of the load circuit 16. After a delay time period, the PWM generator 24 is restarted with a reduced PWM duty cycle (for example, in soft-start mode as discussed above with respect to FIG. 4). After the soft-start period ends, normal PWM drive operation proceeds. However, the duty cycle of the PWM signal during that normal operating mode is dependent on the number of times the OVC signal has previously been asserted logic high. If the number of times exceeds a first threshold (TH1), the PWM generator 24 will generate the PWM signal with a progressively reduced duty cycle. If the over-voltage condition persists and the number of times exceeds a second threshold (TH2>TH1), this is indicative of a persistent problem and operation of the PWM generator is disabled (for example, as discussed above with respect to FIG. 3).

Figure 6:
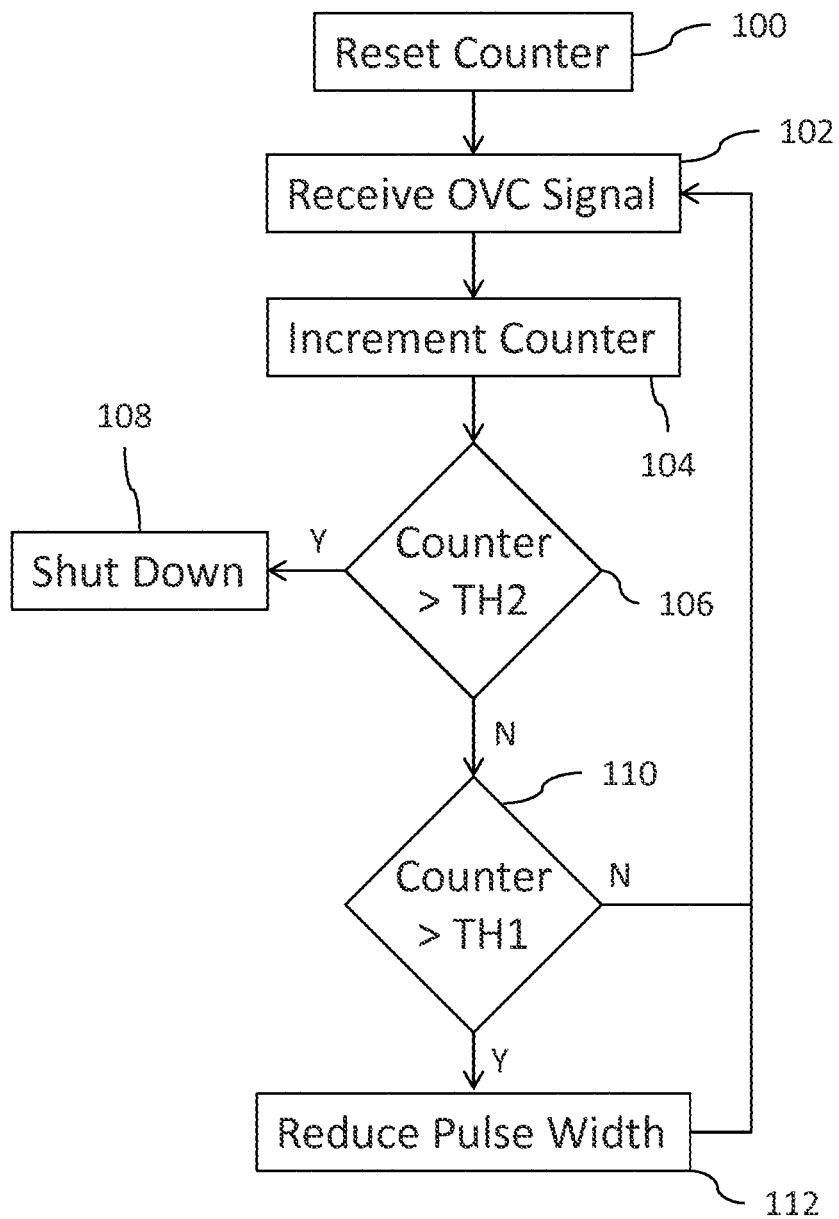
FIG. 6 is a flow diagram illustrating operation of the circuit of FIG. 5.

Reference is now made to FIG. 6 showing a flow diagram illustrating operation of the circuit of FIG. 5 with respect to implementing the excessive over-voltage condition detection circuitry 44. The PWM generator 24 includes a counter configured to track the number of instances that the OVC signal is asserted. That counter is reset in step 100. In step 102, the PWM generator waits for assertion of the OVC signal. When the OVC signal is asserted, the counter is incremented in step 104. A comparison of the count value stored in the counter is then made in step 106 against the second threshold (TH2). If the count value exceeds the second threshold, the PWM generator enters a shut down or disable mode of operation in step 108 wherein no PWM signal is generated. If the comparison in step 106 is not satisfied, the count value is instead compared against the first threshold (TH1) in step 110. If the count value exceeds the first threshold, the PWM generator incrementally reduces the pulse width (duty cycle) of the PWM signal in step 112. The process then returns to step 102 to waits for assertion of the next OVC signal. Upon receipt of the next OVC signal assertion, the comparison processes of steps 106 and 110 (if necessary) are repeated. With each pass through the comparison of step 110, the duty cycle of the PWM signal is progressively reduced. Eventually, in the presence of a persistent over-voltage condition (indicated when the second threshold is exceeded), the comparison of step 106 will be satisfied and a shut down in step 108 occurs.

The PWM generator 24 is implemented, in one example, as integrated circuit device, such as a microcontroller. The excessive over-voltage condition detection circuitry 44 may then be implemented on the microcontroller as a mixture of hardware and software. Additionally, the functionalities for the disable circuitry 40 and the soft-start circuitry 42 may be supported by the microcontroller using hardware or a combination of hardware and software.

In an example of the implementation of the systems shown in FIGS. 2, 4 and 5, the inductor of the resonant tank circuit 16 may comprise the heating coil for an induction heating/cooking system. In such an implementation, a quasi-resonant single switch topology is implemented through the IGBT 14. A transient increase of the supply voltage Vdc can result in damage to the IGBT 14. The assertion of the OVC signal in response to that transient increase protects the IGBT 14 by forcing a turn on of the IGBT 14 and reducing the collector to emitter voltage Vice below the over-voltage threshold. This also results in the discharge of the output capacitance of the IGBT 14 which may, for example, have been charged to an excessive voltage (such as 1150V) in the heating/cooking application. Excessive dissipation and temperature rise in the IGBT 14 may exist over the next few cycles. To address this concern, a record of the number of assertions of the OVC signal is maintained in a counter with the assertion count compared to a number of thresholds. A count in excess of the first threshold causes the system to incrementally decrease pulse width of the PWM drive signal until the over-voltage condition is no longer triggered. This permits the user to continue use of the heating/cooking application. If the count then exceeds the second threshold, the over-voltage condition is considered to be persistent (rather than transient). Further use of the heating/cooking application could be dangerous to the user, and so a shut down of system operation is made. The embodiments accordingly address both short term voltage transient as well as long term over-voltage conditions in order to minimize risk of IGBT failure.

It will be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A circuit, comprising:
   a drive transistor having a control terminal configured to receive a drive signal and having a first conduction terminal and a second conduction terminal, wherein said first conduction terminal is configured for connection to a load circuit;
   a sense circuit configured to sense a voltage across the first and second conduction terminals;
   a comparator circuit configured to compare the sensed voltage to voltage threshold and generate a signal indicative of an over-voltage condition; and
   drive circuitry configured to generate said drive signal in response to a pulse width modulation (PWM) signal, said drive circuit including a force on circuit actuated in response to said signal indicative of the over-voltage condition to force said drive transistor to turn on irrespective of the PWM signal.

2. The circuit of claim 1, wherein the drive transistor is an insulated gate bi-polar transistor (IGBT).

3. The circuit of claim 1, further comprising said load circuit.

4. The circuit of claim 3, wherein said load circuit is a resonant tank circuit.

5. The circuit of claim 1, wherein the drive transistor is a low-side drive transistor.

6. The circuit of claim 1, further comprising a PWM generator circuit configured to generate said PWM signal.

7. The circuit of claim 6, wherein the PWM generator circuit includes a soft start circuit, and wherein the soft start circuit is actuated in response to said signal indicative of the over-voltage condition.

8. The circuit of claim 6, wherein the PWM generator circuit includes an excessive over-voltage condition detection circuit configured to disable generation of the PWM signal if a number of signals indicative of the over-voltage condition are received in excess of a shut down threshold.

9. The circuit of claim 6, wherein the PWM generator circuit includes an excessive over-voltage condition detection circuit configured to reduce a pulse width of the PWM signal if a number of signals indicative of the over-voltage condition are received in excess of a reduction threshold.

10. The circuit of claim 9, wherein the excessive over-voltage condition detection circuit is further configured to incrementally reduce pulse width of the PWM signal with each reception of the signal indicative of the over-voltage condition in excess of said reduction threshold.

11. The circuit of claim 10, wherein the excessive over-voltage condition detection circuit is still further configured to disable generation of the PWM signal if the number of signals indicative of the over-voltage condition received is in excess of a shut down threshold.

12. The circuit of claim 6, wherein the PWM generator circuit includes a disable circuit configured to disable generation of the PWM signal in response to said signal indicative of the over-voltage condition.

13. A method, comprising:
   applying a drive signal to a control terminal of a drive transistor including a conduction terminal configured for connection to a load circuit;
   sensing a voltage across the first and second conduction terminals;
   comparing the sensed voltage to voltage threshold;
   generating a signal indicative of an over-voltage condition in response to said comparing; and
   generating said drive signal in response to a pulse width modulation (PWM) signal,
   wherein generating further comprises forcing said drive transistor to turn on in response to said signal indicative of the over-voltage condition irrespective of the PWM signal.

14. The method of claim 13, further comprising actuating a soft start process for PWM signal generation in response to said signal indicative of the over-voltage condition.

15. The method of claim 13, further comprising disabling PWM signal generation in response to said signal indicative of the over-voltage condition.

16. The method of claim 13, further comprising disabling PWM signal generation if a number of signals indicative of the over-voltage condition are received in excess of a shut down threshold.

17. The method of claim 13, further comprising reducing a pulse width of the PWM signal if a number of signals indicative of the over-voltage condition are received in excess of a reduction threshold.

18. The method of claim 17, further comprising incrementally reducing pulse width of the PWM signal with each reception of the signal indicative of the over-voltage condition in excess of said reduction threshold.

19. The method of claim 18, further comprising disabling generation of the PWM signal if the number of signals indicative of the over-voltage condition received is in excess of a shut down threshold.

20. A circuit, comprising:
- a drive transistor having a control terminal configured to receive a drive signal and having a first conduction terminal and a second conduction terminal, wherein said first conduction terminal is configured for connection to a load circuit;
- a sense circuit configured to sense a voltage across the first and second conduction terminals;
- a comparator circuit configured to compare the sensed voltage to voltage threshold and generate a signal indicative of an over-voltage condition;
- a pulse width modulation (PWM) signal generator configured to generate a PWM signal; and
- a drive circuit configured to generate said drive signal in response to said PWM signal if the signal indicative of an over-voltage condition is not asserted and otherwise force said drive transistor to turn on if the signal indicative of the over-voltage condition is asserted.

21. The circuit of claim 20, wherein the PWM signal generator comprises a soft start circuit actuated when the signal indicative of the over-voltage condition is asserted.

22. The circuit of claim 20, wherein the PWM signal generator comprises a disable circuit actuated when the signal indicative of the over-voltage condition is asserted.

23. The circuit of claim 20, wherein the PWM signal generator comprises a pulse width control circuit configured to reduce a pulse width of the PWM signal in response to assertion of the signal indicative of the over-voltage condition.

24. The circuit of claim 23, wherein the pulse width control circuit is further configured to incrementally reduce the pulse width of the PWM signal with each assertion of the signal indicative of the over-voltage condition.

* * * * *